United States Patent
Moslehi

[11] Patent Number: 5,949,105
[45] Date of Patent: Sep. 7, 1999

[54] INSULATED-GATE FIELD-EFFECT TRANSISTOR STRUCTURE AND METHOD

[75] Inventor: Mehrdad M. Moslehi, Dallas, Tex.

[73] Assignee: Texas Instruments Incorporated, Dallas, Tex.

[21] Appl. No.: 08/024,883

[22] Filed: Mar. 1, 1993

Related U.S. Application Data

[63] Continuation of application No. 07/721,739, Jun. 26, 1991, abandoned.

[51] Int. Cl.⁶ .................................................. H01L 29/76
[52] U.S. Cl. ............................................. 257/336; 257/344
[58] Field of Search ..................................... 257/336, 344

[56] References Cited

U.S. PATENT DOCUMENTS

| | | | |
|---|---|---|---|
| 4,442,449 | 4/1984 | Lehrer et al. | 357/59 K |
| 4,660,062 | 4/1987 | Nishizawa et al. | 357/23.3 |
| 4,771,014 | 9/1988 | Liou et al. | 357/23.3 |
| 4,928,163 | 5/1990 | Yoshida et al. | 357/23.3 |
| 4,935,379 | 6/1990 | Toyoshima | 357/233 |
| 4,943,836 | 7/1990 | Mori | 357/23.14 |
| 4,949,136 | 8/1990 | Jain | 357/23.3 |
| 5,015,598 | 5/1991 | Verhaar | 357/23.3 |
| 5,047,816 | 9/1991 | Cuevas | 357/23.14 |

FOREIGN PATENT DOCUMENTS

| | | | |
|---|---|---|---|
| 63-95670 | 4/1988 | Japan | 357/23.3 |
| 64-764 | 1/1989 | Japan | 357/23.3 |

*Primary Examiner*—Sara Crane
*Attorney, Agent, or Firm*—Robby T. Holland; Carlton H. Hoel; Richard L. Donaldson

[57] ABSTRACT

An insulated-gate field-effect transistor 10 is formed on a semiconductor substrate 8. The source 12 and/or drain 20 junction region comprises a heavily doped region 14 (22), a non-overlapped lightly doped region 16 (24), and an overlapped lightly doped region 18 (26). The doping concentration and junction depth of the overlapped 18 and non-overlapped 16 lightly doped regions may be controlled and optimized independently. An insulating layer 50 is formed over a channel region 28 which separates the source 12 and drain 20, and also over the overlapped portions of the source 18 and drain 26. A gate 42 is formed over the insulating layer 50. Two exemplary methods of fabrication are disclosed in detail herein as well as other systems and methods.

1 Claim, 10 Drawing Sheets

INSULATED-GATE FIELD-EFFECT TRANSISTOR STRUCTURE AND METHOD

This application is a Continuation, of application Ser. No. 07/721,739, filed Jun. 26, 1991, now abandoned.

(C) Copyright, *M* Texas Instruments Incorporated 1991. A portion of the disclosure of this patent document contains material which is subject to copyright and mask work protection. The copyright and mask work owner has no objection to the facsimile reproduction by anyone of the patent document or the patent disclosure, as it appears in the Patent and Trademark Office patent file or records, but otherwise reserves all copyright and mask work rights whatsoever.

FIELD OF THE INVENTION

This invention generally relates to the fabrication of semiconductor devices and specifically to a structure and method for forming an insulated-gate field-effect transistor with a lightly doped drain.

BACKGROUND OF THE INVENTION

The difficulty in the fabrication of small geometry high-performance metal oxide semiconductor field-effect transistors (MOSFETS) is the following quandary: if the source/drain junctions are doped to a level high enough to give reasonably low series resistance, the magnitude of the electric field in the channel adjacent the drain during the on state will be so high that hot carriers and impact ionization effects will become a nuisance and result in lifetime degradation.

As the MOSFET channel becomes shorter, the electric field along the channel becomes stronger (for a given power supply voltage). That is, the potential distribution becomes two dimensional, and the effect of the electric field along the channel can no longer be ignored while considering the effects of the electric field normal to the channel. In particular, where the electric field along the channel is high, as is likely to be in short channel MOS devices, impact ionization is likely to occur near the drain. The resulting substrate current greatly increases the likelihood of device latchup in CMOS technologies. In addition, hot carriers are also likely to be generated by the strong electric field magnitude near the drain, and some of these carriers may be injected into the gate oxide, leading to threshold voltage shift and transconductance degradation.

One approach to minimize the degradation is to reduce the electric field at the drain region to prevent the carriers from achieving sufficient energy to be injected into the gate oxide. This is achieved by grading the junction of the drain by doing two implants into the source/drain region. One of the implants is designed to create a lighter doped region beyond the normal N+ drain region. This can be done by offsetting the heavier implant with a sidewall spacer forming the drain structure, sometimes called a lightly doped drain (LDD). Another approach is simply to do two implants of phosphorus and arsenic in the same region to form a structure which is sometimes called a double doped (or double diffused) drain (DDD). The electric field in the drain region is reduced for both these structures due to the graded drain doping.

With conventional LDD structures, however, it is difficult to independently control the two portions of the LDD regions, namely the overlapped portion which is below the transistor gate and the non-overlapped portion which is not below the transistor gate. Prior art methods which utilize diffusion processes to form the LDD regions cannot control the lateral movement under the gate as well as the depth of the junction independently.

Another method to form an LDD region entails performing an ion implantation under the gate after the gate has been formed. In this method, the ions are implanted at an angle so that impurities may be driven beneath the gate. This process, however, is difficult to control since once again the impurities will be driven downwards as well as laterally under the gate. In other words, there is limited control over the length of the overlapped LDD region and lack of independent control over the LDD region junction depth and lateral overlapped LDD length.

Accordingly, improvements which overcome any or all of the problems are presently desirable.

SUMMARY OF THE INVENTION

Other objects and advantages will be obvious, and will in part appear hereinafter and will be accomplished by the present invention which provides an insulated-gate field-effect transistor (IGFET) including a lightly doped source or drain region and a method for form the same.

An insulated-gate field-effect transistor (IGFET) is formed on a semiconductor substrate. The source and/or drain junction regions comprise a heavily doped region, an overlapped lightly doped region, and a non-overlapped lightly doped region. The doping concentration and junction depth of the overlapped and non-overlapped lightly doped regions may be controlled independently. An insulating layer is formed over a channel region which separated the source and drain, and also over the overlapped portions of the source and drain. A gate is formed over the insulating layer. Two exemplary methods of fabrication are disclosed herein.

An advantage of the invention is that the overlapped and the non-overlapped portions of the source and drain junctions are formed independently from each other and therefore the transistor performance and reliability characteristics may be optimized according to the desired use. The process requirements for the selective semiconductor deposition processes are fairly relaxed and easy to meet.

The controllable overlap of the source/drain regions and the transistor gate can improve the device lifetime under hot-carrier stress. Since the non-overlapped portions are not affected by the overlapped region formation, they may be independently controlled to optimize the transistor characteristics.

Further, the process of the present invention requires a lithography resolution which is equal to the gate length, ie., the minimum feature size. This is an advantage over some prior art techniques which require feature resolutions which are less than the gate length and, therefore, require more stringent patterning (such as in inverse-T-gate LDD or ITLDD devices).

In addition, a preferred embodiment fabrication process provides enough flexibility for independent control of the source and drain doping concentrations in the silicided n+ source/drain junctions and the overlapped and non-overlapped regions. The implant doses and energies may be adjusted for full optimization of the device lifetime (ie., the hot carrier stress lifetime) and performance (eg., surface/bulk punch-through, transconductance, and subthreshold leakage).

In addition, the structure provides a lower gate sheet resistance compared to some conventional LDD structures since it provides a higher silicided gate length than some prior art devices. In one preferred embodiment, this lower sheet resistance can be attributed to the fact that a second selective silicon deposition is used in order to fill the gaps over the thin poly ears before the self-aligned silicide process.

BRIEF DESCRIPTION OF THE DRAWINGS

The above features of the present invention will be more clearly understood from consideration of the following descriptions in connection with accompanying drawings in which.

Corresponding numerals and symbols in the different figures refer to corresponding parts unless otherwise indicated.

DETAILED DESCRIPTION OF PREFERRED EMBODIMENTS

The making and use of the presently preferred embodiments are discussed below in detail. However, it should be appreciated that the present invention provides many applicable inventive concepts which can be embodied in a wide variety of specific contexts. The specific embodiments discussed are merely illustrative of specific ways to make and use the invention, and do not delimit the scope of the invention.

The following is a description of the structure and method of the present invention. An exemplary preferred embodiment will be described first. A first method of fabricating a structure of the invention will then be described along with variations. A second preferred method of forming the structure will then be described.

Figure 1:
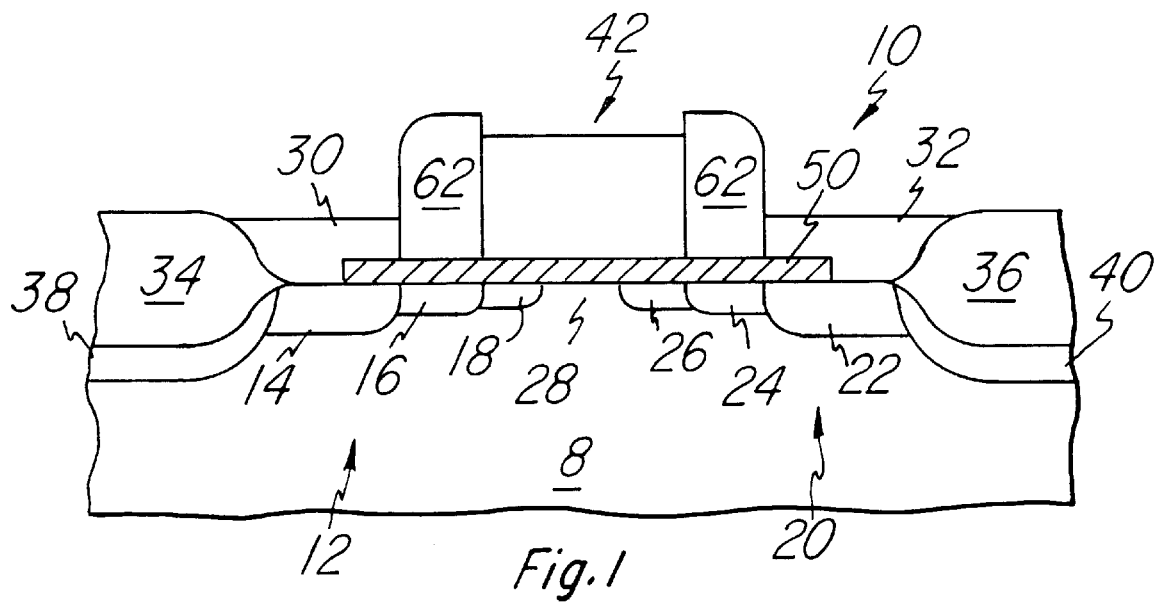
FIG. 1 is a cross-sectional view of a preferred embodiment transistor of the present invention.

Referring first to FIG. 1, an exemplary NMOS (n-channel metal oxide semiconductor) transistor structure 10 is shown. Although an NMOS transistor has been illustrated, a similar PMOS (p-channel metal oxide semiconductor) transistor may be formed. Both NMOS and PMOS transistors may be formed on the same chip, to build CMOS (complementary metal oxide semiconductor) devices, for example. Bipolar technology may also be utilized on the same chip, to form BiCMOS devices, for example. The transistor 10 is typically one transistor in an array of like transistors on a semiconductor chip.

The transistor 10 comprises source region 12 and drain region 20 which are separated by channel region 28. The source region 12 comprises three portions, namely heavily doped portion 14, non-overlapped (ie., not beneath the transistor gate 42) lightly doped portion 16 and overlapped (ie., beneath the transistor gate 42) lightly doped portion 18. Similarly, the drain region 20 comprises three portions, namely heavily doped portion 22, non-overlapped lightly doped portion 24 and overlapped lightly doped portion 26. Of course, functionally the source 12 and the drain 20 may be reversed. Unlike prior art devices, the junction depth and doping concentrations of the non-overlapped 16 and 24 and the overlapped 18 and 26 portions of the source 12 and drain 20 junctions may be controlled independently. This provides a great advantage over prior art transisor structures.

The embodiment illustrated also includes an elevated source region 30 and an elevated drain region 32 which may be included as desired. The elevated source and drain regions 30 and 32 may be formed from silicon, germanium or silicon germanium alloy, using selective semiconductor growth (SSG) for example.

Separating the transistor 10 from other components on the chip are field insulating regions 34 and 36. Field insulating regions 34 and 36 may typically comprise an oxide such as silicon dioxide and are therefore referred to as field oxide regions. Formed below the insulating region 34 is channel stop region 38. Channel stop region 38 is also formed for the purpose of device isolation. In the NMOS embodiment shown, the channel stop region 38 comprises P doped silicon. Generally, the channel stop has a conductivity type opposite that of the source and drain. Similarly, channel stop region 40 is formed beneath insulation region 36 and has characteristics analogous to those of channel stop 38.

Formed above channel region 28 and overlapped lightly doped regions 18 and 26 is gate region 42. Separating the gate region 42 from the channel 28 is an insulation region 50, typically a thin layer of silicon dioxide. Sidewall spacers 62 are formed on the side of the gate region and above non-overlapped source 16 and drain 24.

An illustrative process flow of an exemplary preferred embodiment is shown in FIGS. 2–12. The flow is illustrative of the formation of an NMOS transistor. As is known in the art, modifications may be made to form a PMOS transistor. Typically both NMOS and PMOS transistors may be formed on the same chip for CMOS technologies.

Figure 2:
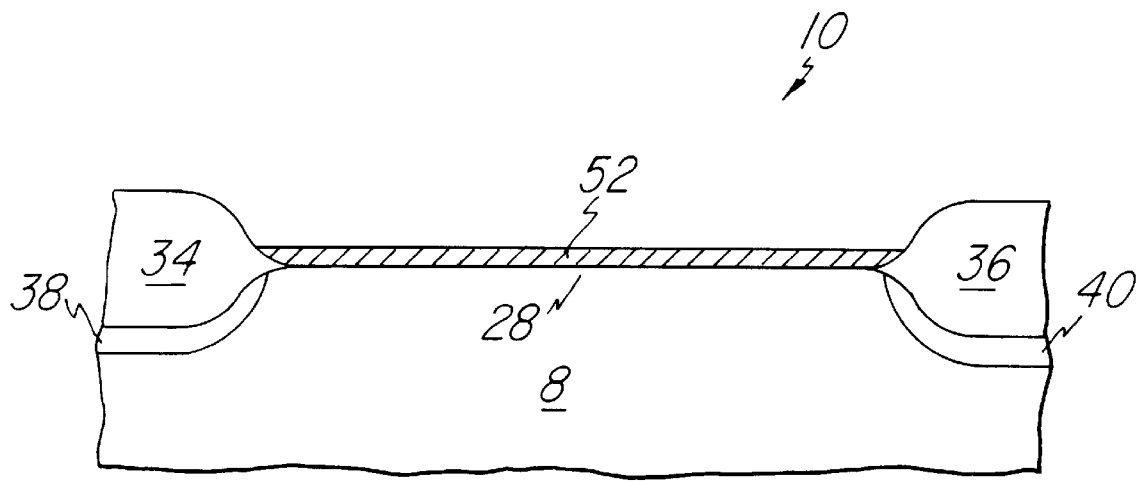
FIGS. 2–12 are cross-sectional views illustrative of the fabrication steps according to a first embodiment of the present invention.

Referring first to FIG. 2, a single crystal silicon substrate 8 is provided. The first step of the exemplary process flow is to form channel stop regions 38 and 40. A typical method is to implant boron ions using well known ion implantation techniques. Other known doping methods such as diffusion may be used. For a P channel device, the impurities may typically be arsenic or phosphorus. Channel stop regions 38 and 40 may be eliminated if they are not desired (depending on the substrate doping concentration).

Next, field insulating regions 34 and 36 are formed by local oxidation followed by growth of the sacrificial insulting layer 52. The field insulating regions 34 and 36 are preferably formed by thermal oxidation of the silicon substrate. As is well known in the art, the oxide will grow in the field regions which are not covered by nitride oxidation mask. Field oxide regions 34 and 36 are typically between 5000 and 7000 Angstroms thick and sacrificial oxide layer 52 is between about 100 and 300 Angstroms thick.

If desired, the channel regions 28 beneath the sacrificial oxide layer 52 may be doped to adjust the threshold voltage of the device and/or to minimize punchthrough. This doping step is typically performed by ion implantation but may also be performed by other methods such as diffusion. The purpose of the channel doping is for design considerations and as such, this step may be partly or completely eliminated.

Additional processing, not shown, may be performed on the surface of channel region 28. For example, a p- epitaxial silicon layer may be deposited followed by a p epitaxial silicon layer for deep punch through prevention. Then, a p- epitaxial layer is formed followed by a p epitaxial layer for threshold adjustment. These steps can replace the channel ion implantation steps but may be left out without effecting the purpose of the present invention.

Figure 3:
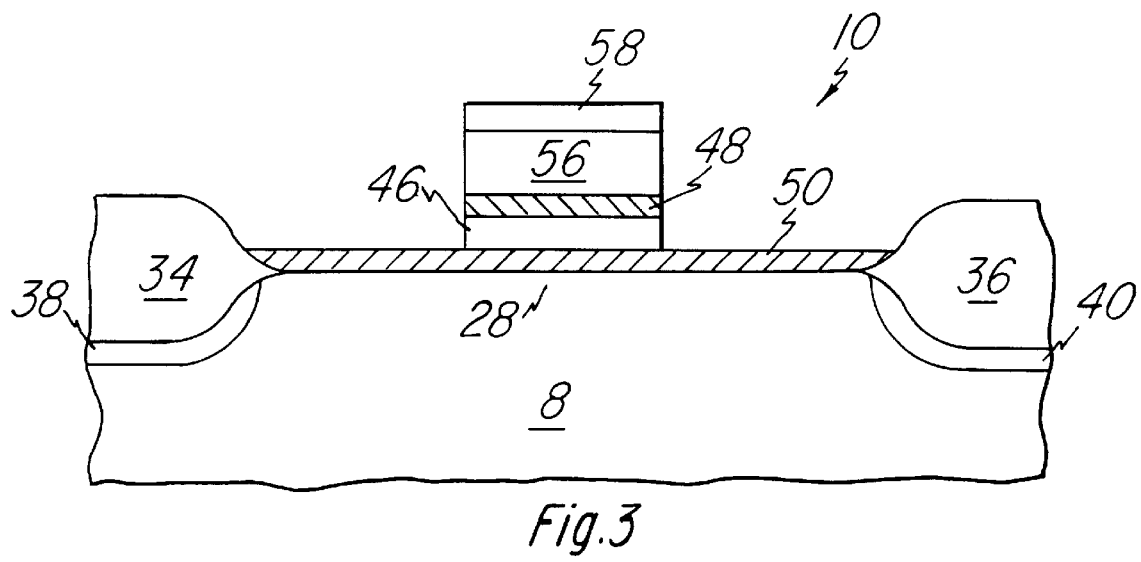

Referring now to FIG. 3, sacrificial or dummy gate oxide layer 52 is removed using well-known damage free etch methods and gate oxide 50 is grown. In a preferred embodiment, the gate oxide 50 is between around 60 and 100 Angstroms thick. This thickness is in line with 0.35 $\mu$m CMOS technology.

The next step in the exemplary process flow is to form the gate stack. The first step here is to perform a blanket deposition of a layer 46 of amorphous or polycrystalline silicon to between about 100 and 1000 Angstroms thick. Next a thin oxide 48, typically between about 10 and 100 Angstroms thick is formed. This oxide layer 48 may be either thermally grown or chemically grown and will serve as an etch-stop layer. Next, a thick disposable gate region 56 is formed to the desired gate height, typically between about 2000 and 4000 Angstroms. The thick disposable gate 56 may be formed by deposition of amorphous or polycrystalline silicon. Finally a thin layer of nitride 58 overlayer is formed. The nitride layer 58 is typically deposited by low pressure chemical-vapor deposition (LPCVD) and is typically between 100 and 800 Angstroms thick. The nitride layer 58 will serve as an oxidation mask during subsequent device processing.

The surface is then masked using well-known photolithographic techniques to pattern the gate region. An in-situ anisotropic etch is then performed to etch nitride layer 58, silicon layer 56, oxide layer 48, and silicon layer 46. The chemistries used for performing this etch are known and for simplicity will not be discussed here. Preferably, the gate formation etch is performed in the same chamber (in-situ multi-step etch).

Figure 4:
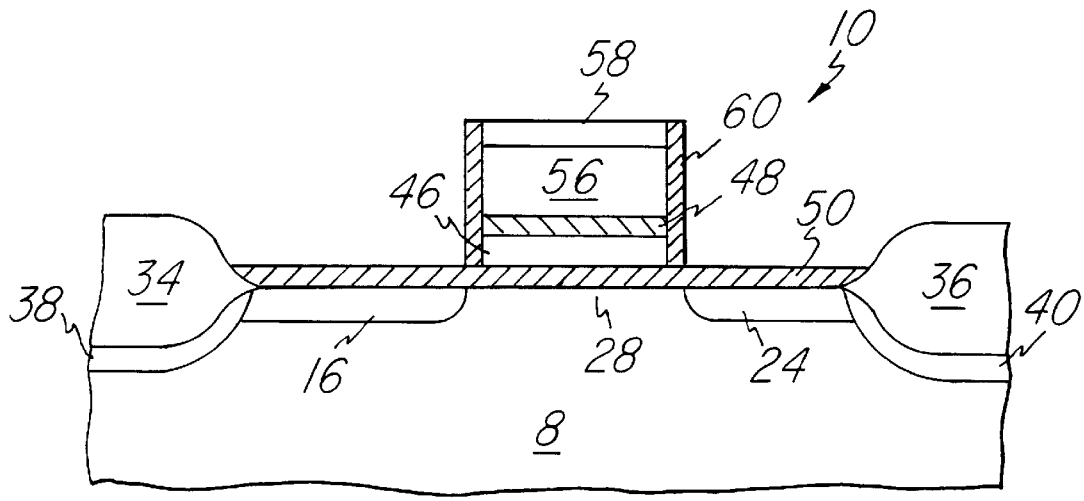

Referring now to FIG. 4, first lightly doped regions 16 and 24 are formed. These regions will serve as the non-overlapped portions, i.e., the portions not beneath the gate, of the source and drain. The non-overlapped LDD portions 16 and 24 are typically formed by implanting arsenic or phosphorus or antimony for NMOS devices or by implanting boron for PMOS devices. Other dopants, however, may be used. The junction depth is typically between 400 and 1000 Angstroms thick and the concentration is engineered to the device requirement, typically in the range of about $1 \times 10^{13} m^{-3}$ to $5 \times 10^{14} m^{-3}$.

Also illustrated in FIG. 4 is the formation of thin sidewall oxide 60. The sidewall oxide may be deposited by an LPCVD TEOS (tetraethooxysilane) process, for example. The first sidewall oxide 60 is typically between about 50 and 200 Angstroms thick. The order of the lightly doped region formation and the first sidewall oxide formation may be reversed as is illustrated in FIG. 4.

Figure 5:
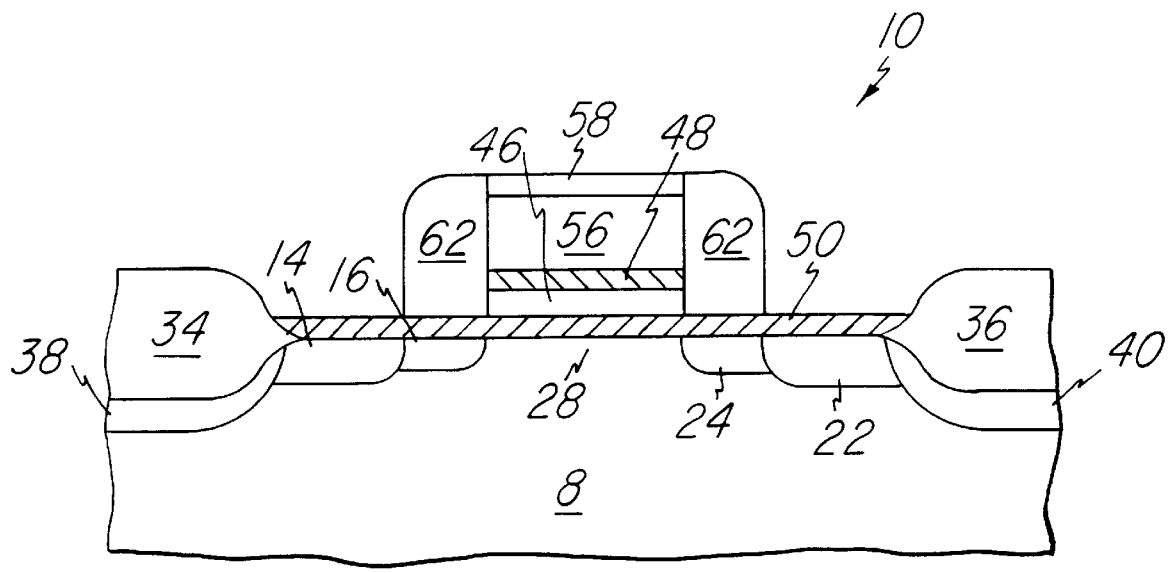

Referring next to FIG. 5, second sidewall spacers 62 are formed adjacent to the thin oxide sidewall 60. The sidewall spacers 62 are typically formed by LPCVD TEOS (blanket deposition) followed by a reactive ion etch (RIE) anisotropic etch process. The thickness of sidewall spacers 62 will correspond to the length of non-overlapped regions 16 and 24 and should be designed accordingly. Typically, the thickness of the sidewall spacers 62 is between 500 and 3000 Angstroms.

The RIE process with overetch may also clear the oxide layer 50 from above the source and drain regions. If so, the source and drain may be oxidized to a thickness of between 50 and 200 Angstroms. Note that nitride layer 58 will block the gate 56 from being oxidized during the source/drain reoxidation step.

The source 14 and the drain 22 may now be implanted to create heavily doped N+ regions for an NMOS transistor. This implantation step may be eliminated (postponed to a later stage) if elevated source and drain regions are to be used as will be discussed later with reference to FIG. 9.

Figure 6:
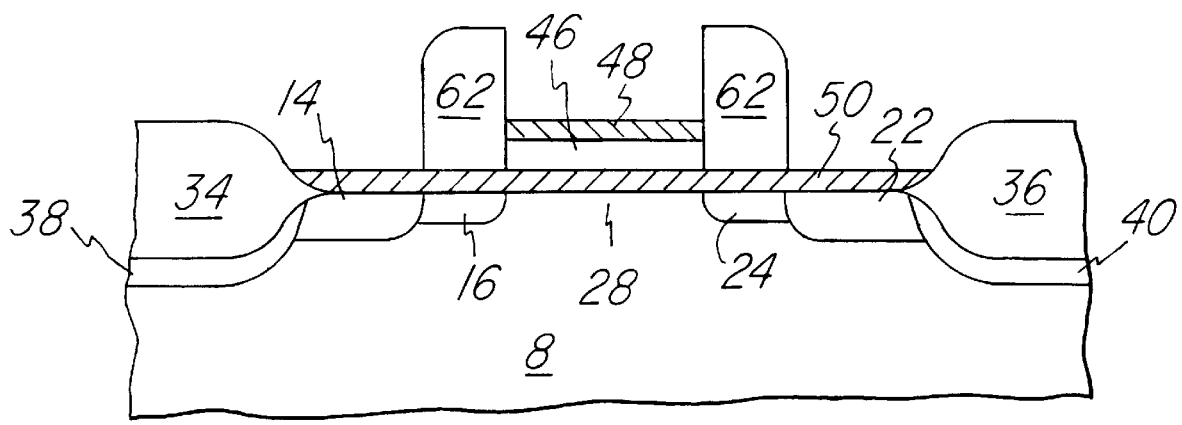

Referring now to FIG. 6, a very short oxide deglaze is performed to clear the surface of the top nitride 58. This step will not damage the exposed oxide layers. A selective, possibly isotropic, nitride etch, either wet or dry, is then performed to remove nitride layer 58. Next, a selective, possibly isotropic, silicon etch is performed to remove the disposable silicon layer 56. These highly selective etches will not disturb the regrown oxide layer 50 or the oxide layer 48, which serves as an etch stop to prevent etching of silicon layer 46.

Figure 7:
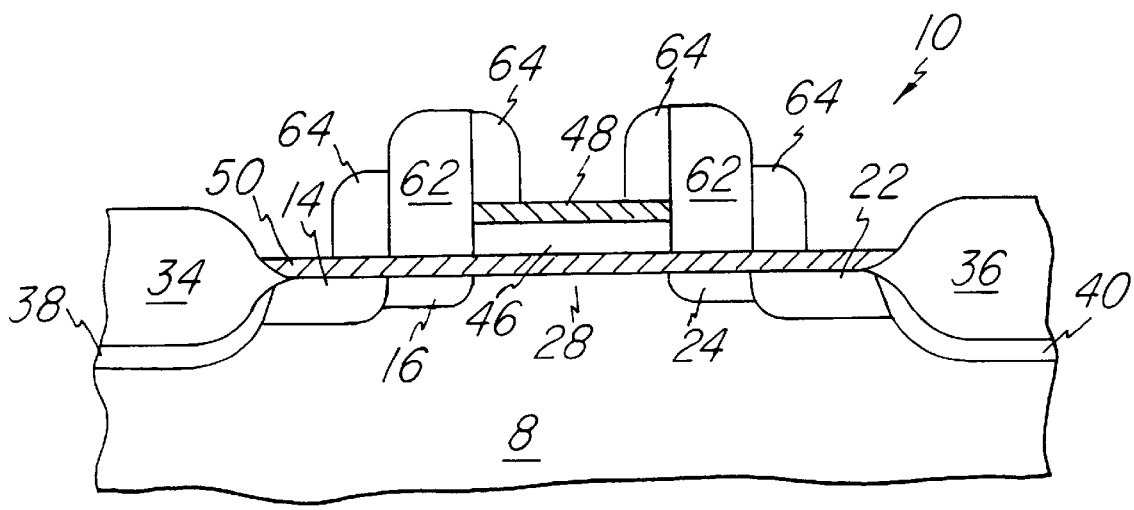

An LPCVD nitride blanket conformal deposition is then performed, followed by a nitride RIE to create nitride spacers 64 on the inner and outer surfaces of the sidewall spacer 62. This step is illustrated in FIG. 7. The thickness of the nitride spacer 64 will determine the length of overlapped portion of the lightly doped source and drain regions (overlapped LDD regions).

Figure 8:
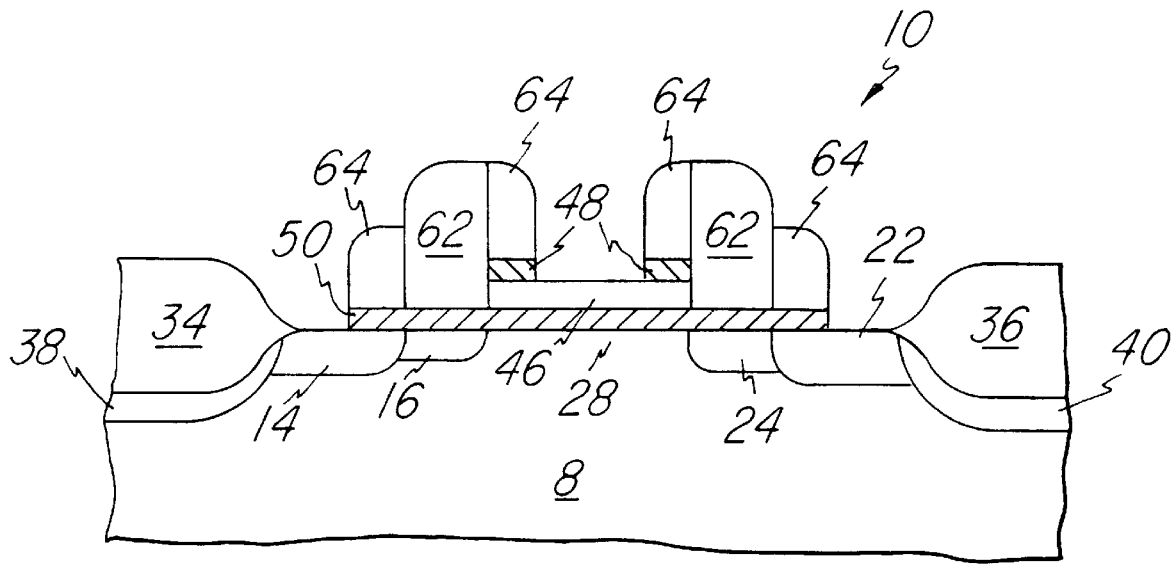

Depending upon the selectivity of the RIE, the oxide layer 50 may be cleared, as illustrated in FIG. 8. If elevated source and drain regions are required, this removal of the layer 50 above the source and drain is desirable. As such, if it was not removed during the RIE it should be etched by either an oxide RIE or a timed wet etch. On the other hand, if an elevated source and drain structure is not required, the oxide layer 50 should be reformed over the source 14 and drain 22 regions. Notice that a portion of the oxide layer 48 has also been removed.

Figure 9:
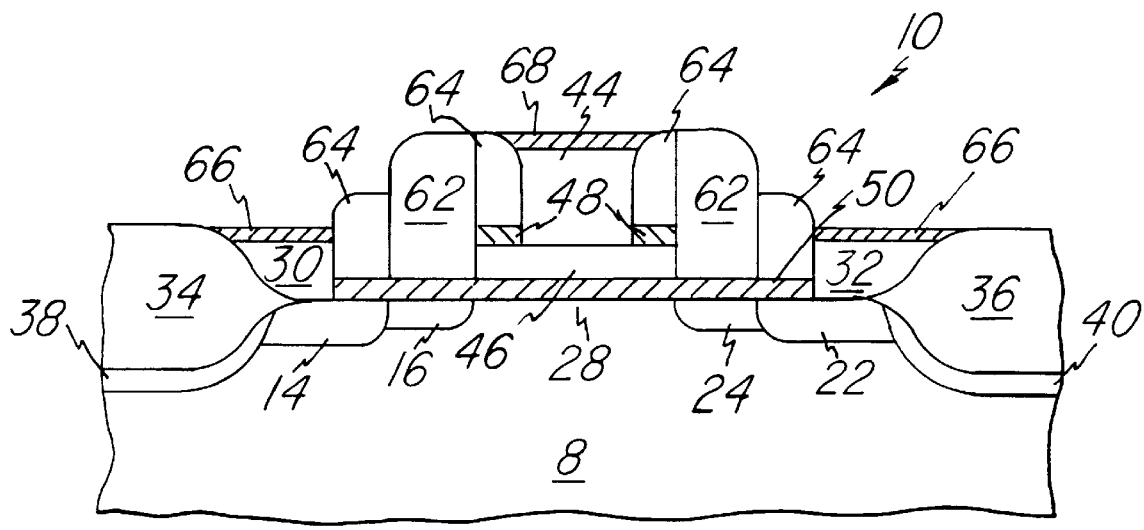

Referring now to FIG. 9 a selective semiconductor growth (SSG) is performed to create elevated source region 30 and elevated drain region 32, and gate region 44. The SSG, typically a chemical-vapor deposition process, will grow silicon on the exposed portion of source 14, drain 22 and gate 46. Typically, if a deposition takes place on a single crystal substrate, such as on the source 14 and drain 22, the deposited layer will also be single crystal. If the surface is not clean enough, however, the elevated source and drain 30 and 32 regions will be polycrystalline. This does not typically create a problem. The SSG may be silicon, germanium, or silicon/germanium alloy as examples. The elevated source 30, elevated drain 32 and gate 44 may be in-situ doped or doped after the SSG process. In addition, the source 14 and drain 22 may be formed at this step if they were not performed as discussed earlier with respect to FIG. 5.

Following the selective semiconductor growth (SSG) is a short thermal oxidation to create a 30 to 100 Angstrom layer 66 over the elevated source 30 and drain 32 as well as oxide layer 68 over the gate.

Figure 10:
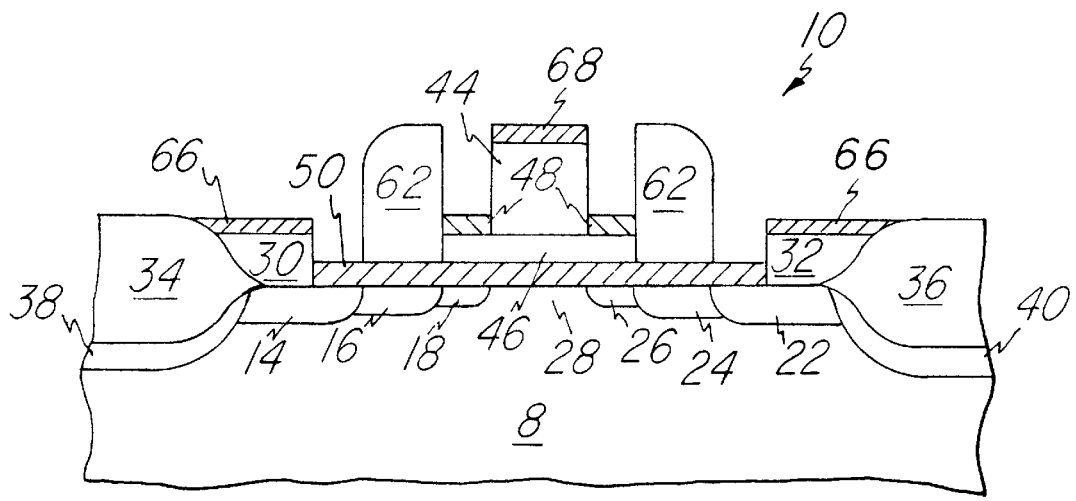

Referring now to FIG. 10, a selective, preferably isotropic, nitride etch is performed to remove the nitride spacer 64. Removal of the nitride spacers will create an opening in which the overlapped lightly doped portions 18 and 26 may be created.

The overlapped lightly doped source 18 and drain 26 regions may be formed by implanting arsenic or phosphorus or antimony for an NMOS device. The implantation will only occur through the thin portions of the gate 48 (and also into the source 14 and the drain 22; however, this is not critical). It is important to notice that the overlapped lightly doped source 18 and drain 26 regions have been formed independently of non-overlapped portions 16 and 24 with respect to doping concentration and junction depth.

Figure 11:
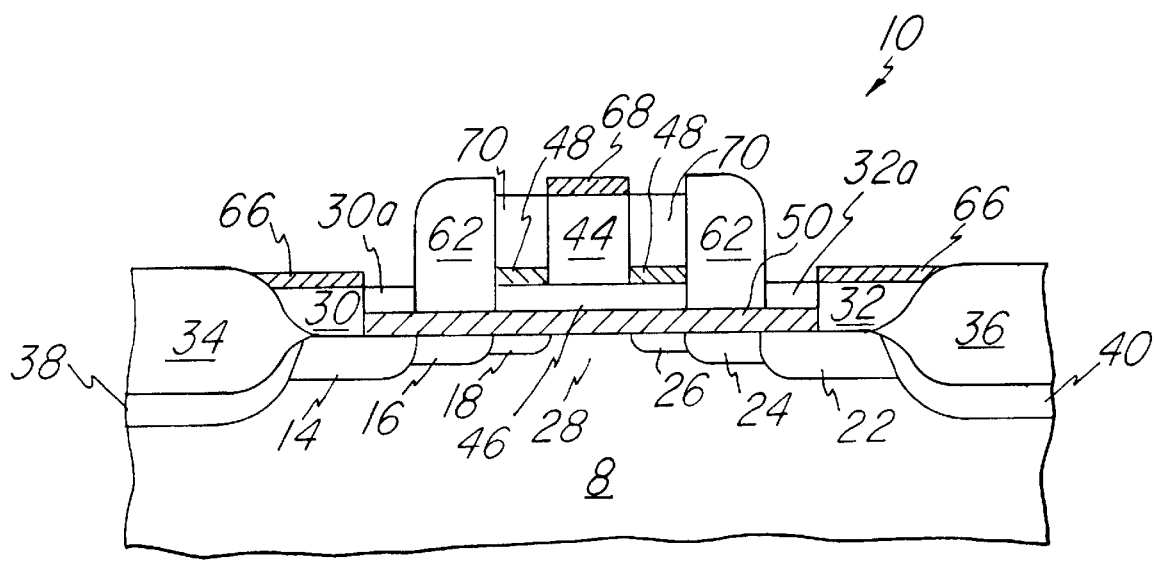

There are a number of ways to complete the fabrication flow. The first is illustrated in FIG. 11. The trenches are filled by SSG to create additional elevated source region 30A and elevated drain region 32A and gate regions 70. The SSG may once again be silicon, germanium or silicon/germanium alloy and may be either doped or undoped.

Alternatively, the trenches may be filled with LPCVD polycrystalline or amorphous silicon or LPCVD oxide followed by an RIE. This process would be simpler than an SSG and, therefore, may be preferable. If an LPCVD oxide is used, however, the conductive portion of the gate will be smaller and, therefore, would affect the gate propagation delay time.

Figure 12:
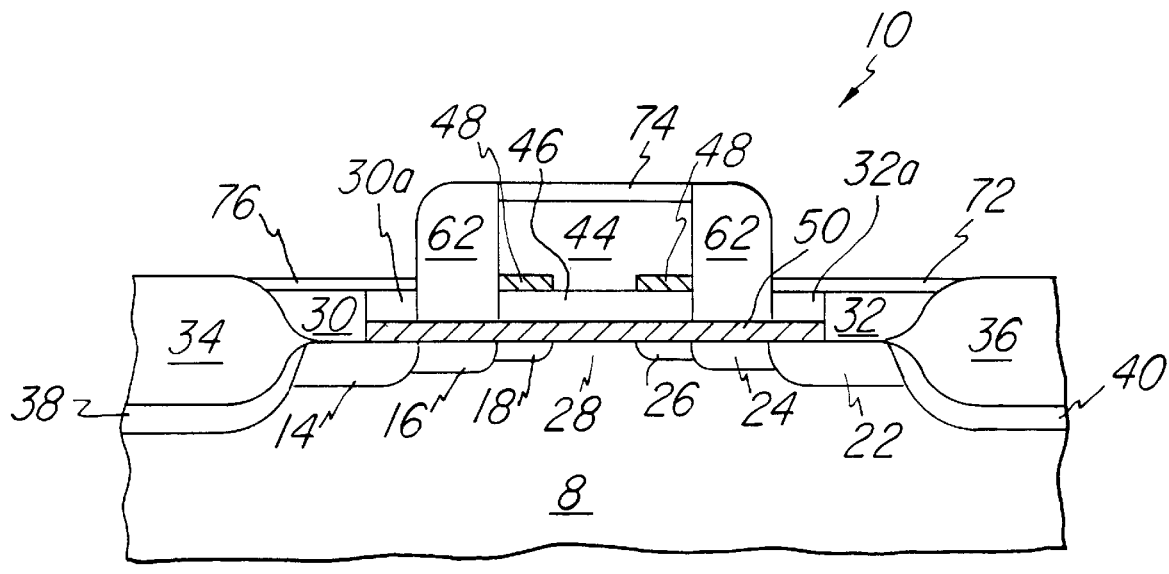

Illustrated in FIG. 12 is an exemplary salicide (self-aligned silicide) process. After removing any remaining insulating material form the source, drain, and gate, a refractory metal, such as titanium for example, is sputtered to form region 76 over the source 14, region 74 over the gate 44 and region 72 over the drain 16. A reaction is then created to create the silicide. After removing the excess unsilicided or unreacted metal, this device is annealed. The silicide is used here to create lower source/drain and gate series resistance values.

Several well known steps have been left out of the process flow for the sake of simplicity. For example, numerous cleaning processes are performed throughout the process flow, especially immediately prior to depositions. Other modifications as are well known in the art may also be included.

A second illustrative process flow of an exemplary preferred embodiment is shown in FIGS. 13–18. The flow is once again illustrative of the formation of an NMOS transistor. As is known in the art, modifications may be made to form a PMOS transistor. Typically both NMOS and PMOS transistors may be formed on the same chip for CMOS device fabrication.

Figure 13:
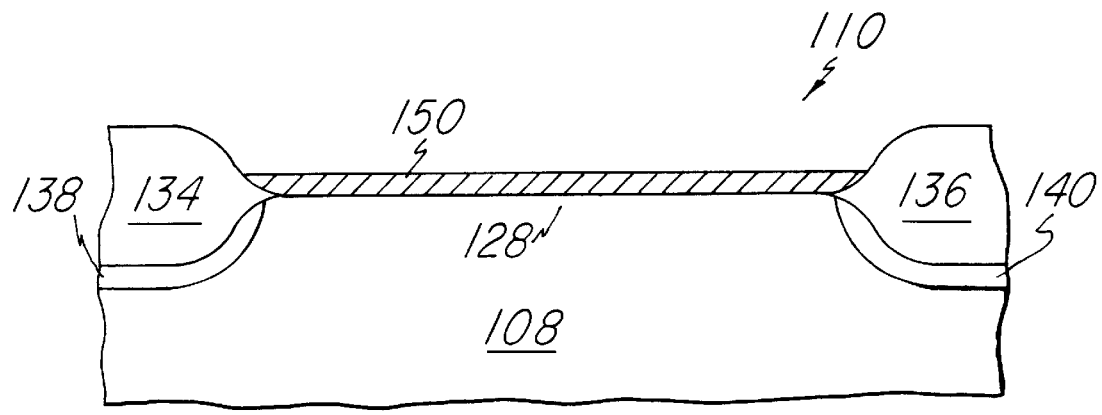
FIGS. 13–18 are cross-sectional views illustrative of the fabrication steps according to a second embodiment of the present invention.

Referring first to FIG. 13, as before a single crystal silicon substrate 108 is provided. The first step of the exemplary process flow is to form channel stop regions 138 and 140 as previously described with respect to FIG. 2. Again, insulating regions 134 and 136 are formed along insulting layer 150 as previously described and the channel area 128 may be doped as before.

Figure 14:
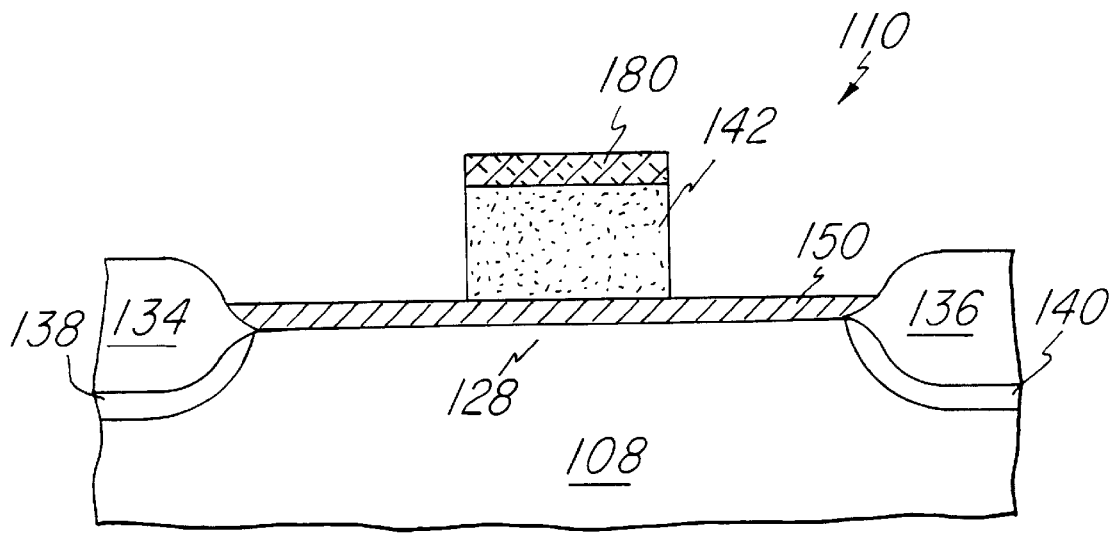

Referring now to FIG. 14, a low pressure chemical-vapor deposition process is performed to form about 35 Å of polysilicon. The polysilicon layer 142 may be in situ doped or doped subsequently by ion implantation. Typical dopants may be arsenic or phosphorus.

Following the polysilicon 142 deposition is the deposition of an insulating layer 180. The insulating layer 180 is typically LPCVD nitride, such as silicon nitride, or LPCVD oxide, such as silicon dioxide, with a thickness of about 1000 angstroms.

The polysilicon 142 and insulating 180 layers are then patterned and anisotropically etched using well known photolithographic and etching techniques to form the gate electrode 142 over the device channel region 128.

Figure 15:
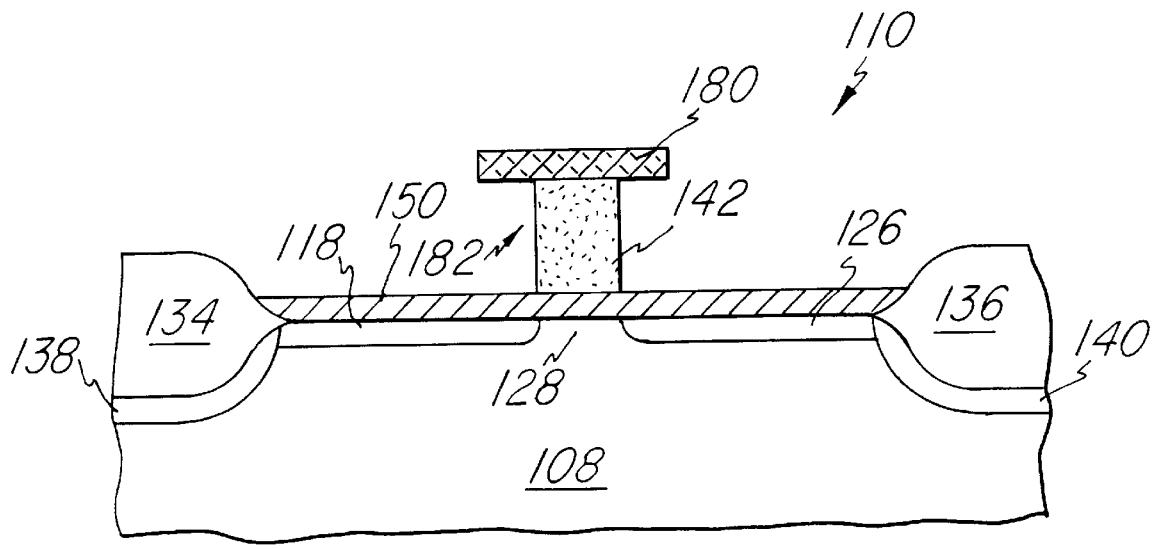

Referring now to FIG. 15, lateral undercut regions 182 are formed by performing a timed isotropic polysilicon etch. The etch is selective so that it does not disturb the insulating region 180 or the substrate 108. The etch must be uniform so that all gates on the wafer will be formed the same. The distance of the etch beneath the insulating region 180 will correspond to the length of the overlapped lightly doped source 118 and drain 126.

Next the overlapped source 118 and drain 126 are formed. Typically, the overlapped source 118 and drain 126 are implanted with arsenic or phosphorus for an NMOS device and boron for a PMOS device. The implant energy is such that the ions will be implanted through the overhanging portion of nitride or oxide layer 180 and form shallow LDD junctions (with gate overlap).

If an asymmetrical device, not shown, is required a sidewall (not shown) may be formed on the silicon gate 142 prior to performing the timed isotropic etch. In this manner only one of the source or drain would include a lightly doped overlapped portion.

Figure 16:
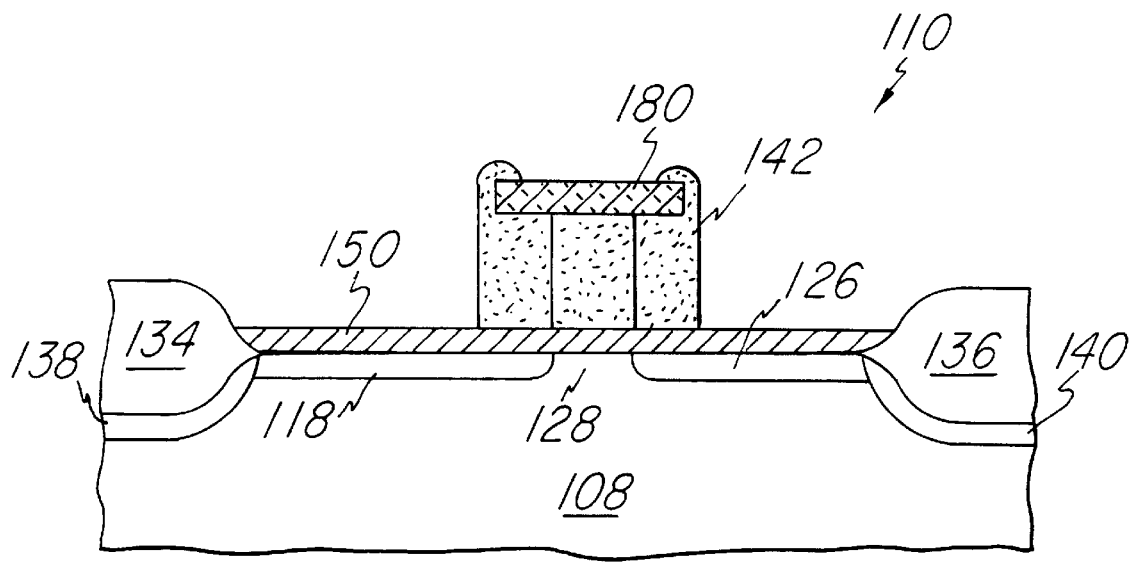

Referring next to FIG. 16, a selective semiconductor deposition is performed to regrow polysilicon gate 142. Typically the gate 142 is overgrown to ensure that fill coverage occurs and the lateral tunnels are filled completely.

Figure 17:
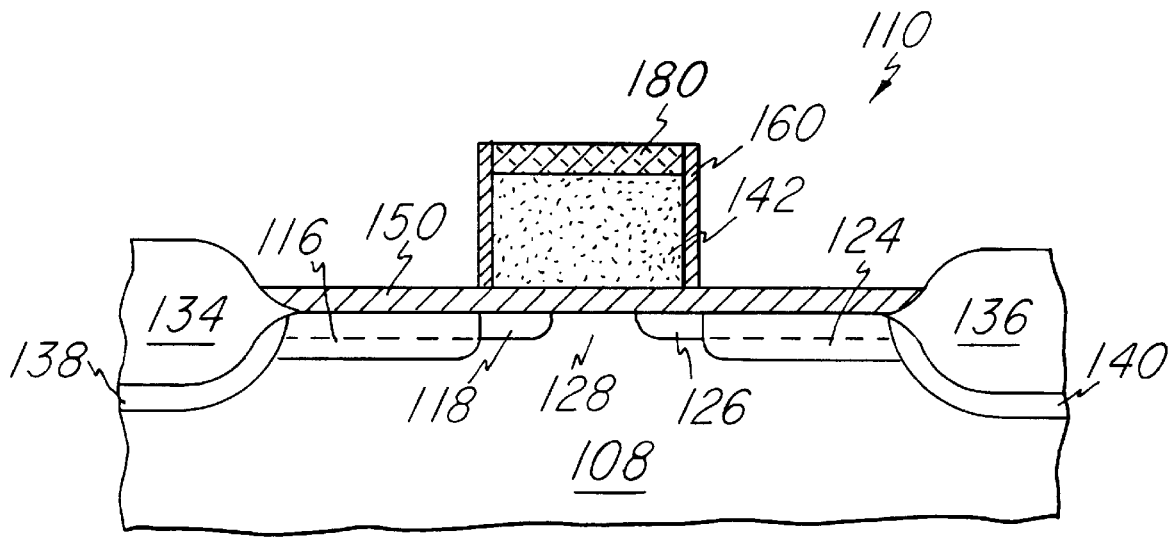

The silicon gate 142 is then anisotropically etched selectively to insulating layer 180 as shown in FIG. 17. The silicon gate 142 is now beneath the insulating layer 180 and is once again self aligned as it was in the earlier stages of the processing.

Next, non-overlapped lightly doped regions 116 and 124 are formed. The non-overlapped portions are typically formed by implanting arsenic or phosphorus for NMOS devices or by implanting boron for PMOS devices and has characteristics as described above with respect to the first fabrication embodiment. In this embodiment, the doping characteristics of non-overlapped regions 116 and 124 are in addition to those of the previously formed overlapped regions 118 and 126. This is a disadvantage over the previously discussed process flow (FIGS. 2–12). This second embodiment, however, is simpler and therefore may be desirable in some applications.

Also illustrated in FIG. 17 is the formation of thin sidewall oxide 160. The sidewall oxide may be deposited by an LPCVD TEOS process, for example. The sidewall oxide 160 is typically between about 50 and 100 Angstroms thick. The order of the second LDD formation and the first sidewall oxide formation may be reversed, if desired.

Figure 18:
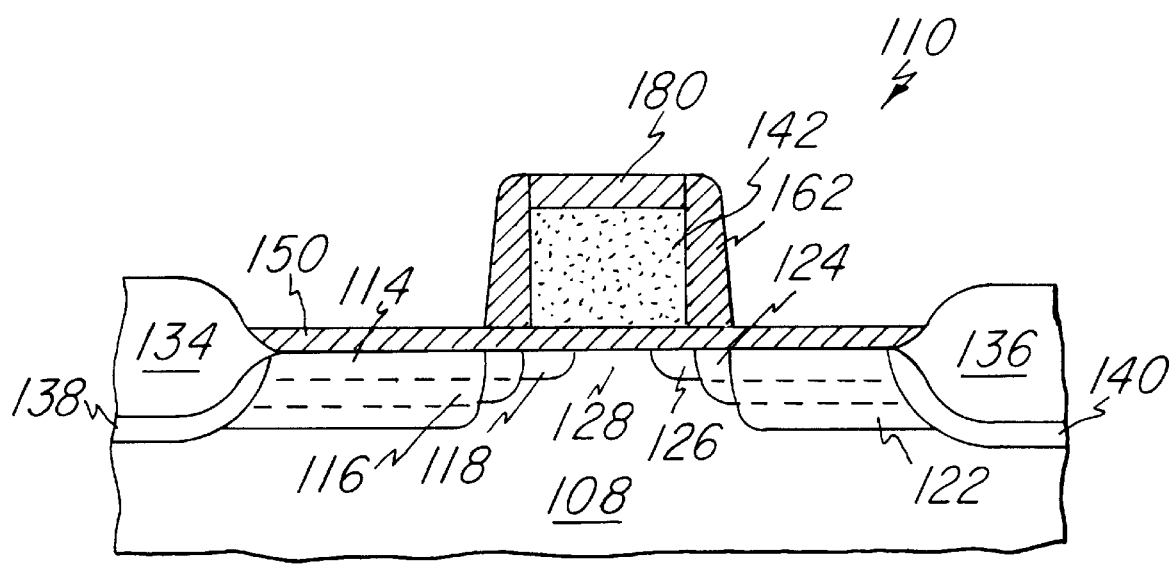

Referring now to FIG. 18, thicker sidewall spacers 162 are formed adjacent to sidewalls 160. The sidewall spacers 162 are typically formed by oxide or nitride LPCVD and a subsequent RIE. The width of the sidewall spacers 162 will correspond to the width of non-overlapped regions 116 and 124.

Finally, the heavily doped portion of the source 114 and the drain 122 are formed using standard doping techniques such as ion implantation. At this point, three independently formed regions have been formed for both the source and drain junctions.

The final steps of the process flow, not shown, would be performed according to design choice. For example, a salicide process similar to the one described with respect to FIG. 12 may be performed.

Once again, several well known steps have been left out of the process flow for the sake of simplicity. For example, numerous cleaning processes are performed throughout the process flow, especially immediately prior to depositions. Other modifications as are well known in the art may also be included.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. An insulated-gate field-effect transistor, comprising:
   a semiconductor substrate;
   a drain region formed in said semiconductor substrate, said drain region comprising a heavily doped region, a first lightly doped region with a first selected doping concentration and junction depth and a second lightly doped region with a second selected doping concentration and junction depth, wherein said first selected doping concentration and junction depth is independent of said second selected doping concentration and depth and wherein said second selected doping concentration and junction and depth is independent of said first selected doping concentration and junction depth;

source region formed in said semiconductor substrate;

a channel region separating said source and drain regions;

an insulating layer formed over said channel region and over said lightly doped drain region;

a conductive gate formed over said insulating layer;

an elevated semiconductor source region formed above said heavily doped portion of said source and an elevated semiconductor drain region formed above said heavily doped portion of said drain; and wherein said elevated source and drain regions comprise a single crystal semiconductor.

* * * * *